(12) United States Patent
Nogami et al.

(10) Patent No.: US 9,716,185 B2
(45) Date of Patent: Jul. 25, 2017

(54) FIELD EFFECT TRANSISTOR

(71) Applicant: Mitsubishi Electric Corporation, Tokyo (JP)

(72) Inventors: Yoichi Nogami, Tokyo (JP); Kenichi Horiguchi, Tokyo (JP); Norio Higashisaka, Tokyo (JP); Shinsuke Watanabe, Tokyo (JP); Toshiaki Kitano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/002,748

(22) Filed: Jan. 21, 2016

(65) Prior Publication Data
US 2016/0322487 A1 Nov. 3, 2016

(30) Foreign Application Priority Data
Apr. 30, 2015 (JP) ................. 2015-092654

(51) Int. Cl.
*H01L 29/812* (2006.01)
*H01L 29/778* (2006.01)
(Continued)

(52) U.S. Cl.
CPC ...... *H01L 29/8124* (2013.01); *H01L 29/0619* (2013.01); *H01L 29/0692* (2013.01);
(Continued)

(58) Field of Classification Search
CPC .......... H01L 29/8124; H01L 29/41758; H01L 29/423; H01L 29/0619; H01L 29/7786; H01L 29/66462; H01L 29/0692
See application file for complete search history.

(56) References Cited

U.S. PATENT DOCUMENTS

| 5,994,727 A * | 11/1999 | Lee ................... H01L 29/66863 257/275 |
| 8,410,558 B2 * | 4/2013 | Inoue .................. H01L 21/765 257/409 |

(Continued)

FOREIGN PATENT DOCUMENTS

| JP | 01-293649 | 11/1989 |
| JP | 2008-518462 | 5/2008 |

(Continued)

*Primary Examiner* — Tom Thomas
*Assistant Examiner* — Vincent Wall
(74) *Attorney, Agent, or Firm* — Studebaker & Brackett PC

(57) ABSTRACT

A field effect transistor includes: a semiconductor substrate having a main surface; a plurality of source electrodes and a plurality of drain electrodes alternately disposed and ohmic-connected with the main surface of the semiconductor substrate; a plurality of gate electrodes Schottky-connected with the main surface of the semiconductor substrate and respectively disposed between the plurality of source electrodes and the plurality of drain electrodes; and a Schottky electrode Schottky-connected with the main surface of the semiconductor substrate, wherein each of the plurality of drain electrodes has first and second portions separated from each other, a sum of widths of the first and second portions of each drain electrode is smaller than a width of one source electrode, the Schottky electrode is disposed between the first portion and the second portion of the drain electrode.

9 Claims, 3 Drawing Sheets

(51) Int. Cl.
  *H01L 29/417* (2006.01)
  *H01L 29/06* (2006.01)
  *H01L 29/66* (2006.01)
  *H01L 29/423* (2006.01)
  *H01L 29/20* (2006.01)

(52) U.S. Cl.
  CPC ...... *H01L 29/41758* (2013.01); *H01L 29/423* (2013.01); *H01L 29/66462* (2013.01); *H01L 29/778* (2013.01); *H01L 29/7786* (2013.01); *H01L 29/2003* (2013.01)

(56) References Cited

U.S. PATENT DOCUMENTS

| | | | | |
|---|---|---|---|---|
| 8,791,503 | B2* | 7/2014 | Briere | H01L 29/2003 257/194 |
| 9,018,683 | B2* | 4/2015 | Otsuji | H01L 29/42316 257/250 |
| 2007/0228424 | A1* | 10/2007 | Igarashi | H01L 27/0207 257/256 |
| 2010/0252863 | A1* | 10/2010 | Kawasaki | H01L 23/4824 257/192 |
| 2011/0233559 | A1* | 9/2011 | Ishikura | H01L 21/82348 257/76 |
| 2012/0001230 | A1* | 1/2012 | Takatani | H01L 21/76895 257/194 |
| 2012/0220089 | A1* | 8/2012 | Imada | H01L 29/0619 438/270 |
| 2014/0084331 | A1* | 3/2014 | Parthasarathy | H01L 27/0248 257/121 |

FOREIGN PATENT DOCUMENTS

| | | |
|---|---|---|
| JP | 2011-204984 | 10/2011 |
| JP | 2012-028441 | 2/2012 |
| WO | 2006/137841 | 12/2006 |

\* cited by examiner

-COMPARATIVE EXAMPLE-

FIELD EFFECT TRANSISTOR

BACKGROUND OF THE INVENTION

Field of the Invention

The present invention relates to a field effect transistor.

Background Art

A GaN high-electron-mobility-transistor (HEMT) device is formed by using a substrate having a GaN-based epitaxial layer formed on a Si substrate. With the GaN HEMT device, high-efficiency, high-power-density, high-voltage operation can be realized in comparison with operation with a Si- or GaAs-based device because of its excellent material properties including a high saturated electron velocity and a high dielectric breakdown withstand voltage. This enables a transmitter to be reduced in size, weight and power consumption. Therefore, GaN HEMT devices are considered promising as a next-generation radiofrequency high-output electron device for communication. For example, on the market of portable telephone base station amplifiers as a typical application field, where Si-LDMOS devices are widely available presently, a device capable of operating with a further increased output and efficiency has been in demand with the increases in communication frequencies and the development in communication technology, and there are increasing expectations for GaN HEMT devices.

While there are expectations for GaN HEMT devices in terms of performance, there is a product price problem with making GaN HEMT devices practically available on the market. Diffusion of GaN HEMT devices has already been started in various market fields. On the market of portable telephone base station amplifiers, however, the state of GaN HEMT devices being high-priced in comparison with that of Si-LDMOS devices widely available on the market is thought to be one of the hindrances to the promotion of the diffusion.

GaN HEMT devices presently used for communication ordinarily use a substrate having a GaN-based epitaxial layer grown on a SiC substrate. Because the SiC substrate is much higher in price and smaller in substrate diameter than the Si substrate, the price of the GaN HEMT device finished as a product is necessarily increased.

On the other hand, Si substrates which can be easily increased in diameter and are low-priced in comparison with SiC substrates are also used as a substrate material for GaN HEMT devices. With GaN HEMT devices using Si substrates, there are expectations of producing the devices at a manufacturing cost close to that of manufacturing of Si-LDMOS devices as well as expectations of overcoming the above-mentioned product price problem.

GaN HEMT devices using Si substrates as their substrates, however, entail a problem in terms of device characteristic described below. In general, it is desirable that a radiofrequency output electronic device use, as a substrate material for achieving high performance at radiofrequencies, a substrate material having a high specific resistance for the purpose of reducing a parasitic capacitance. In a case where a Si substrate is used as a substrate for such a device, therefore, a high-resistance substrate of 1000 Ω·cm or higher made by a floating zone (FZ) method which enables easily making a substrate of a higher resistance in comparison with the Czochralski (CZ) method, the mainstream among Si crystal growth methods, is ordinarily used. A GaN HEMT device made by using a high-resistance Si substrate of 1000 Ω·cm or higher can actually have electrical characteristics which, at least in the current frequency band in which the device is used as a portable telephone base station amplifier, compare favorably with those of a GaN HEMT device made by using a SiC substrate as its substrate.

A semiconductor exhibits a material characteristic such that the intrinsic carrier density increases with increase in temperature. Because Si is a material narrower in bandgap than SiC, the intrinsic carrier density of Si is higher than that of SiC. Further, the temperature dependence of the intrinsic carrier density of Si is increased if the specific resistance at room temperature is increased. Because of the material characteristic of such a high-resistance Si substrate, a GaN HEMT device using the high-resistance Si substrate has a problem that if the temperature during RF operation is increased, the specific resistance of the Si substrate is reduced to cause an increase in loss and a considerable reduction in gain and hence reductions in output and efficiency.

As means for solving the problem of degradations in RF characteristics during high-temperature RF operation in a GaN HEMT device using a Si substrate, each of increasing the spacing between gate regions which are self-heat generation sources, increasing the so-called gate pitch and reducing the parasitic capacitance produced between drain electrodes and the substrate by reducing the drain electrode width is effective. More specifically, the thermal resistance of the device can be reduced by increasing the gate pitch, thus enabling limiting of the increase in temperature during RF operation and hence limiting of the increase in intrinsic carrier density. The drain electrode area can be reduced by reducing the drain electrode width, thus enabling reducing the parasitic capacitance produced between the drain electrodes and the substrate. As described above, deteriorations in RF characteristics during high-temperature RF operation in a GaN HEMT device using a Si substrate can be effectively limited if the two measures can be simultaneously taken.

On the other hand, a semiconductor device in which a drain electrode is divided into two or more parts such that the sum of the widths of the divided parts of each drain electrode is smaller than the width of one source electrode has been proposed (see, for example, FIG. 4 in National Publication of International Patent Application No. 2008-518462). In this way, the gate pitch can be designed independently of the drain electrode width, thus enabling limiting the thermal resistance. Further, even when the gate pitch is increased, the drain electrode area can be reduced by dividing the drain electrode into two or more parts, thus avoiding an increase in parasitic capacitance. This leads to limiting of deteriorations in RF characteristics during high-temperature RF operation in a GaN HEMT device using a Si substrate.

A GaN HEMT device, however, has a high-concentration two-dimensional electron gas layer (2DEG) at an AlGaN/GaN hetero interface, and the influence of the parasitic capacitance between a channel layer and the substrate in drain regions between two or more divided parts of a drain electrode is considerably large. Therefore, the parasitic capacitance reduction effect is restricted if only a reduction in drain electrode area is made. As a result, the effect of limiting deteriorations in RF characteristics during high-temperature RF operation in a GaN HEMT device using a Si substrate is restricted.

SUMMARY OF THE INVENTION

In view of solving the above-described problems, an object of the present invention is to provide a field effect transistor capable of effectively limiting deteriorations in RF characteristics due to an increase in loss accompanying an increase in intrinsic carrier density during high-temperature RF operation.

According to the present invention, a field effect transistor includes: a semiconductor substrate having a main surface; a plurality of source electrodes and a plurality of drain electrodes alternately disposed and ohmic-connected with the main surface of the semiconductor substrate; a plurality of gate electrodes Schottky-connected with the main surface of the semiconductor substrate and respectively disposed between the plurality of source electrodes and the plurality of drain electrodes; and a Schottky electrode Schottky-connected with the main surface of the semiconductor substrate, wherein each of the plurality of drain electrodes has first and second portions separated from each other, a sum of widths of the first and second portions of each drain electrode is smaller than a width of one source electrode, the Schottky electrode is disposed between the first portion and the second portion of the drain electrode.

In the present invention, the Schottky electrode is disposed between the first portion and the second portion of each drain electrode. Therefore, the parasitic capacitance produced between the drain region and the semiconductor substrate can be effectively reduced by applying a negative voltage for completely pinching off (depleting) a 2DEG channel layer right below the Schottky electrode. Deteriorations in RF characteristics due to an increase in loss accompanying an increase in intrinsic carrier density during high-temperature RF operation of the field effect transistor can thus be limited effectively.

Other and further objects, features and advantages of the invention will appear more fully from the following description.

DETAILED DESCRIPTION OF THE PREFERRED EMBODIMENTS

A field effect transistor according to the embodiments of the present invention will be described with reference to the drawings. The same components will be denoted by the same symbols, and the repeated description thereof may be omitted.

First Embodiment

Figure 1:
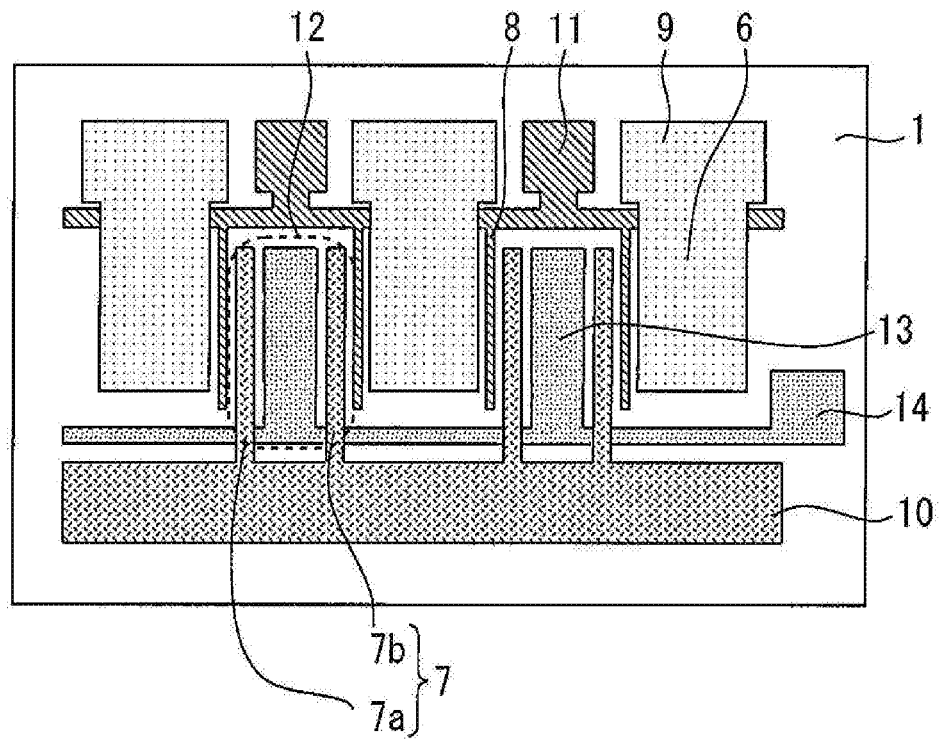
FIG. 1 is a plan view of a field effect transistor according to a first embodiment of the present invention.
Figure 2:
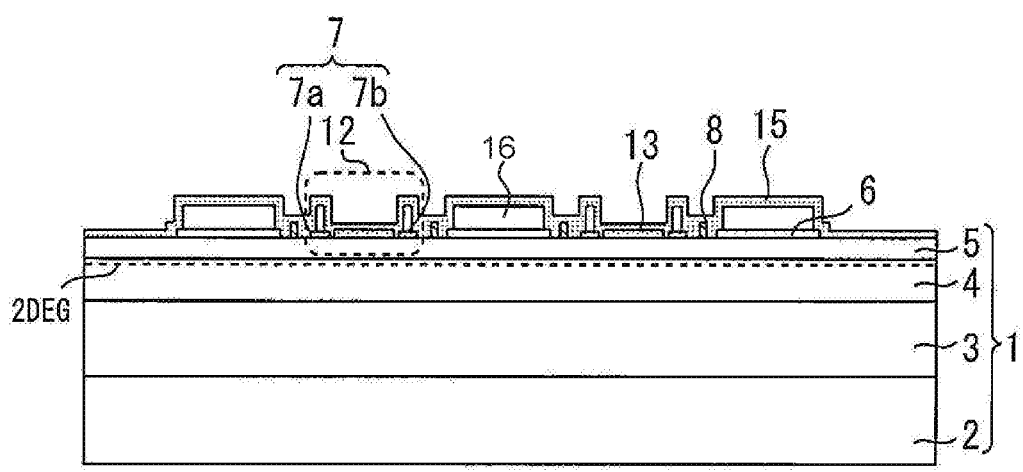
FIG. 2 is a sectional view of the field effect transistor according to the first embodiment of the present invention.

FIG. 1 is a plan view of a field effect transistor according to a first embodiment of the present invention. FIG. 2 is a sectional view of the field effect transistor according to the first embodiment of the present invention. A semiconductor substrate 1 includes a high-resistance Si substrate 2, a GaN-based buffer layer 3, a GaN layer 4 and an AlGaN layer 5, the layers 3, 4, and 5 being successively grown on the high-resistance Si substrate 2a.

A plurality of source electrodes 6 and a plurality of drain electrodes 7 are alternately disposed while being ohmic-connected with a main surface of the semiconductor substrate 1. A plurality of gate electrodes 8 are Schottky-connected with the main surface of the semiconductor substrate 1 and respectively disposed between the plurality of source electrodes 6 and the plurality of drain electrodes 7. A plurality of transistors are thereby formed in comb form. Source pads 9, a drain pad 10 and gate pads 11 are respectively connected electrically to the plurality of source electrodes 6, the plurality of drain electrodes 7 and the plurality of gate electrodes 8.

Each of the plurality of drain electrodes 7 has, in a drain region 12, first and second portions 7a and 7b separated each other. No source electrode 6 and no gate electrode 8 exist between the first portion 7a and the second portion 7b adjacent to each other. It is desirable that the drain electrode 7 be extremely thin in width in minimizing a parasitic capacitance produced between the drain electrode 7 and the semiconductor substrate 1. However, the width of the drain electrode 7 is determined from design particulars restricted by the number of drain electrodes 7, the length and thickness of the drain electrodes 7, a forming process and other factors determined from the desired output electric power that varies product by product. The sum of the electrode widths of the first and second portions 7a and 7b of each drain electrode 7 among them is smaller than the width of one source electrode 6. If the total width of each drain electrode 7 is within the desired total width range, the number by which the drain electrode 7 is divided may be three or more.

A Schottky electrode 13 is Schottky-connected with the main surface of the semiconductor substrate 1 while being disposed between the first portion 7a and the second portion 7b of each drain electrode 7 in the drain region 12. The Schottky electrode 13 is electrically connected not to portions including the gate electrodes 8 but to a pad 14 for enabling external voltage control. Further, surfaces of the source electrodes 6, the drain electrodes 7, the gate electrodes 8, the Schottky electrodes 13 and the semiconductor substrate 1 are insulated and protected with an insulating film 15.

In the present embodiment, as described above, each drain electrode 7 is divided and is made smaller in width than the source electrode 6. The area of the drain electrode 7 can thereby be minimized in a range according to design restriction particulars, thus enabling reducing the parasitic capacitance produced between the drain electrode 7 and the semiconductor substrate 1. Although the width of the drain electrode 7 is reduced, the gate pitch straddling the drain electrode 7 (drain region) is not reduced since the drain electrode 7 is divided. Consequently, the gate pitch for obtaining the desired thermal resistance can be designed with flexibility without being dependent on the width of the drain electrode 7.

Figure 3:
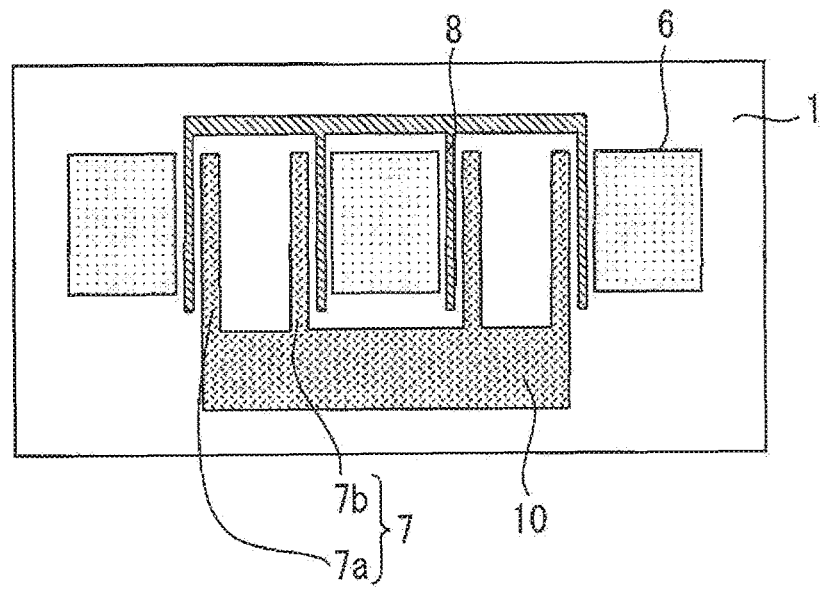
FIG. 3 is a plan view of a field effect transistor according to a comparative example.

The advantage of the present embodiment will subsequently be described by comparison with a comparative example. FIG. 3 is a plan view of a field effect transistor according to a comparative example There is no Schottky electrode 13 in the comparative example. Therefore, the influence of the parasitic capacitance between the channel layer and the substrate in the drain region 12 between two or more portions into which the drain electrode 7 is divided is increased. For this reason, the parasitic capacitance reducing effect is restricted when only a reduction in drain electrode area is made. As a result, the effect of limiting deteriorations in RF characteristics during high-temperature RF operation in a GaN HEMT device using a Si substrate is restricted.

On the other hand, in the present embodiment, the Schottky electrode 13 is disposed between the first portion 7a and the second portion 7b of each drain electrode 7. Therefore, the parasitic capacitance produced between the drain region 12 and the semiconductor substrate 1 can be effectively reduced by applying a negative voltage for completely pinching off (depleting) a 2DEG channel layer right below the Schottky electrode 13. Deteriorations in RF characteristics due to an increase in loss accompanying an increase in intrinsic carrier density during high-temperature RF operation of the field effect transistor can thus be limited effectively. In particular, a higher improvement effect can be obtained on a GaN HEMT device using a substrate having a GaN-based epitaxial layer grown on a high-resistance Si substrate having an intrinsic carrier concentration higher than that of a SiC substrate at a high temperature and having higher temperature dependence.

Figure 4:
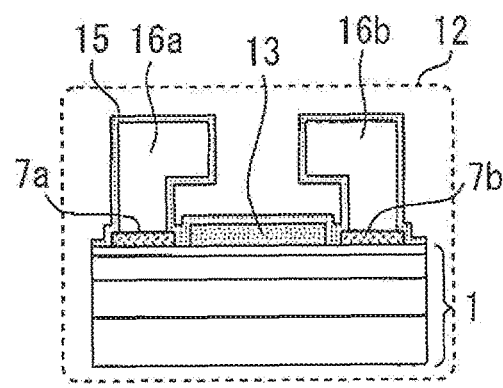
FIG. 4 is a sectional view of a modified example 1 of the drain region according to the first embodiment of the present invention.
Figure 5:
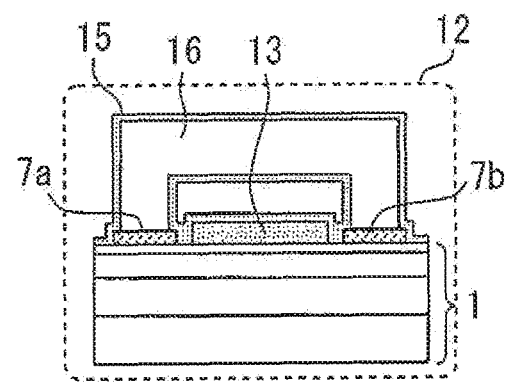
FIG. 5 is a sectional view of a modified example 2 of the drain region according to the first embodiment of the present invention.

FIG. 4 is a sectional view of a modified example 1 of the drain region according to the first embodiment of the present invention. Electrode layers 16a and 16b provided on the drain electrode 7 have a shed roof shape extending over the Schottky electrode 13 inwardly in the drain region 12 (toward a center). FIG. 5 is a sectional view of a modified example 2 of the drain region according to the first embodiment of the present invention. An electrode layer 16 provided on the drain electrode 7 has an air-bridge structure such as to be connected to the first and second portions 7a and 7b in a floating state without contacting the semiconductor substrate 1 and the Schottky electrode 13. The constructions according to the modified examples 1 and 2 may be mixedly provided along the longitudinal direction of the drain electrode 7.

With this arrangement, the allowable current density in the drain region 12, which tends to be a dominant design restriction, can be increased. In a case where the design restriction due to the allowable current density is large, the electrode width of the first and second portions 7a and 7b can be further reduced so that the parasitic capacitance produced between the drain region 12 and the semiconductor substrate 1 is smaller.

Second Embodiment

Figure 6:
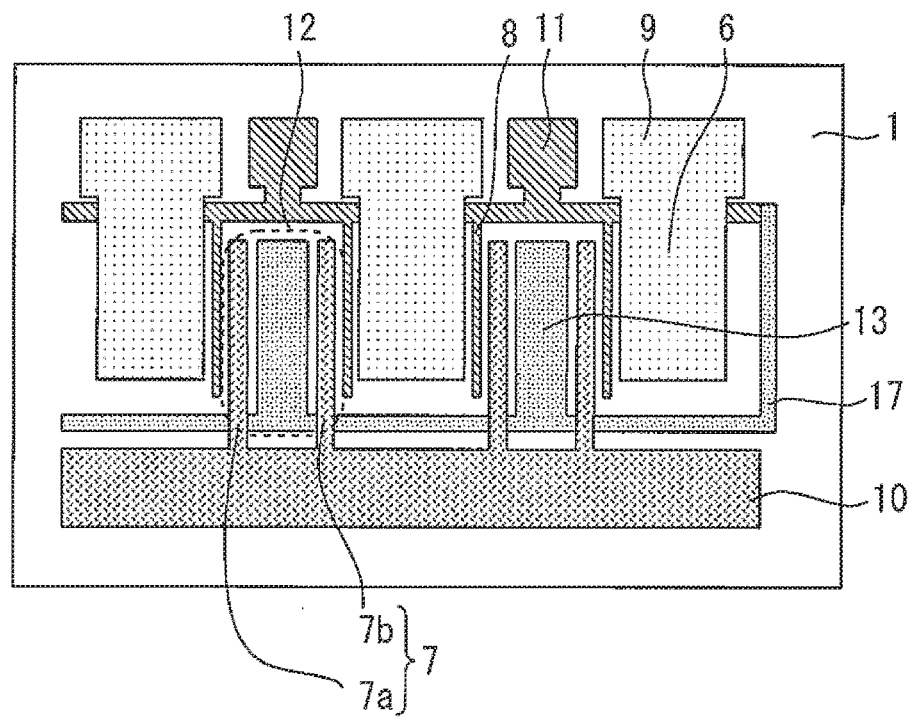
FIG. 6 is a plan view of a field effect transistor according to a second embodiment of the present invention.

FIG. 6 is a plan view of a field effect transistor according to a second embodiment of the present invention. The plurality of gate electrodes 8 and the Schottky electrodes 13 are electrically connected to each other by a conductor 17. While the effect of reducing the parasitic capacitance produced between the drain region 12 and the semiconductor substrate 1 is thereby reduced in comparison with the first embodiment, the need for voltage control through the Schottky electrodes 13 with a power supply voltage separately provided as in the first embodiment 1 is eliminated. The gate voltage applied to the gate electrodes 8 at the time of RF operation is also applied to the Schottky electrodes 13. Therefore, the electron concentration in the 2DEG channel layer is subjected to modulation with a depletion layer and the parasitic capacitance can be reduced in comparison with the case where the Schottky electrodes 13 are not formed.

Third Embodiment

Figure 7:
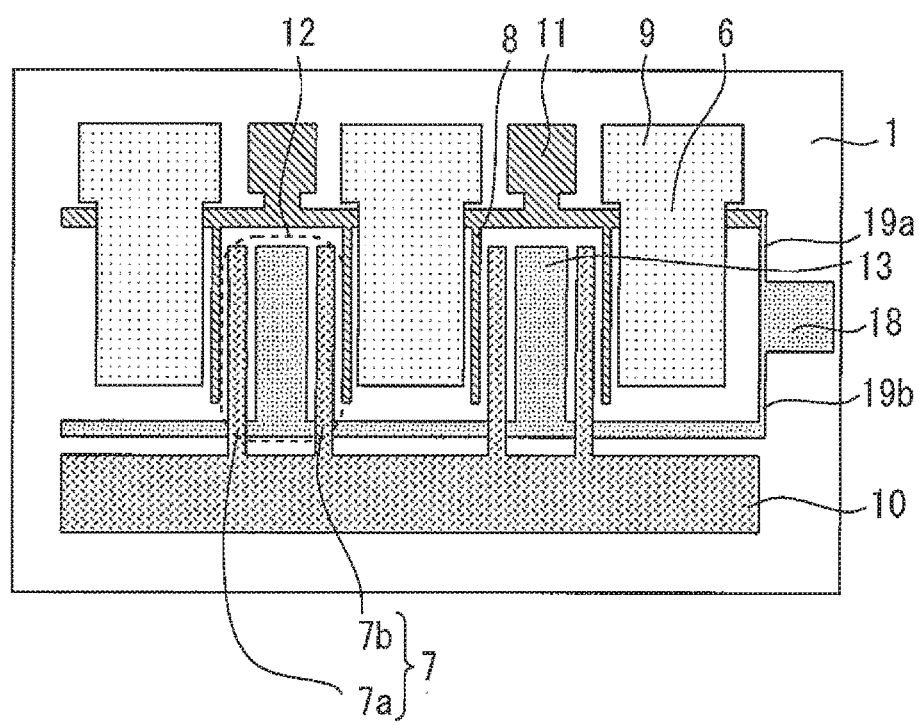
FIG. 7 is a plan view of a field effect transistor according to a third embodiment of the present invention.

FIG. 7 is a plan view of a field effect transistor according to a third embodiment of the present invention. A common pad 18 is electrically connected to the plurality of gate electrodes 8 and the Schottky electrodes 13. A first resistor 19a is connected between the plurality of gate electrodes 8 and the common pad 18. A second resistor 19b is connected between the Schottky electrodes 13 and the common pad 18.

With the resistance values of the resistors 19a and 19b, the voltage applied to the gate electrodes 8 and the voltage applied to the Schottky electrodes 13 can be controlled with respect to the voltage applied to the common pad 18. While process steps for forming the resistors 19a and 19b are added, the parasitic capacitance produced between the drain region 12 and the semiconductor substrate 1 can be reduced in comparison with the second embodiment.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-092654, filed on Apr. 30, 2015 including specification, claims, drawings and summary, on which the Convention priority of the present application is based, is incorporated herein by reference in its entirety.

What is claimed is:

1. A field effect transistor comprising:
a semiconductor substrate having a main surface;
first and second source electrodes ohmic-connected with the main surface of the semiconductor substrate;
a drain electrode including first and second fingers ohmic-connected with the main surface of the semiconductor substrate, wherein the first and second fingers are disposed between the first and second source electrodes;
first and second gate electrodes Schottky-connected with the main surface of the semiconductor substrate wherein the first gate electrode is disposed between the first source electrode and the first finger, and the second gate electrode is disposed between the second finger and the second source electrode; and
a Schottky electrode Schottky-connected with the main surface of the semiconductor substrate, wherein
a sum of widths of the first and second fingers is smaller than a width of one of the first and second source electrodes, and
the Schottky electrode is disposed between the first finger and the second finger, and
wherein no source electrode is provided between the first and second fingers of the drain electrode.

2. The field effect transistor of claim 1, further comprising a pad connected electrically to the Schottky electrode,
wherein the Schottky electrode is not electrically connected to the first and second gate electrodes.

3. The field effect transistor of claim 1, wherein the Schottky electrode is electrically connected to the first and second gate electrodes.

4. The field effect transistor of claim 3, further comprising:
a common pad electrically connected to the first and second gate electrodes and the Schottky electrode;
a first resistor connected between the first and second gate electrodes and the common pad; and
a second resistor connected between the Schottky electrode and the common pad.

5. The field effect transistor of claim 1, further comprising an electrode layer on the drain electrode and extending over the Schottky electrode.

6. The field effect transistor of claim 1, further comprising an electrode layer on the drain electrode and connected to the first and second fingers without contacting the semiconductor substrate and the Schottky electrode.

7. The field effect transistor of claim 1, wherein the semiconductor substrate includes a Si substrate and a GaN-based epitaxial layer on the Si substrate.

8. The field effect transistor of claim 7, wherein the GaN-based epitaxial layer includes an AlGaN/GaN HEMT structure.

9. The field effect transistor of claim 1, wherein a sum of widths of the first and second fingers is smaller than a width of one of the first and second source electrodes.

* * * * *